United States Patent
Yin et al.

(10) Patent No.: US 8,075,248 B2
(45) Date of Patent: *Dec. 13, 2011

(54) FAN ASSEMBLY

(75) Inventors: Xiu-Zhong Yin, Shenzhen (CN); Lin Xiao, Shenzhen (CN)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 1221 days.

This patent is subject to a terminal disclaimer.

(21) Appl. No.: 11/760,738

(22) Filed: Jun. 9, 2007

(65) Prior Publication Data

US 2008/0151495 A1 Jun. 26, 2008

(30) Foreign Application Priority Data

Dec. 22, 2006 (CN) .......................... 2006 2 0016703

(51) Int. Cl.
*F04D 29/64* (2006.01)
*F04D 29/66* (2006.01)

(52) U.S. Cl. ......... 415/60; 415/61; 415/119; 415/213.1; 415/214.1; 248/562; 248/599; 248/638; 454/184; 361/695

(58) Field of Classification Search ............. 415/60, 415/61, 66, 213.1, 214.1, 119; 248/562, 248/599, 638; 454/184; 361/695; 439/894
See application file for complete search history.

(56) References Cited

U.S. PATENT DOCUMENTS

| 5,788,566 | A  | * | 8/1998  | McAnally et al. | 454/184 |
| 6,961,248 | B2 | * | 11/2005 | Vincent et al.  | 361/796 |
| 7,545,641 | B2 | * | 6/2009  | Chen            | 361/695 |
| 7,697,287 | B2 | * | 4/2010  | Yin             | 361/695 |
| 7,699,692 | B2 | * | 4/2010  | Yin             | 454/184 |
| 7,713,025 | B2 | * | 5/2010  | Chen et al.     | 415/213.1 |
| 2005/0106003 | A1 | * | 5/2005 | Fang           | 415/60 |

* cited by examiner

*Primary Examiner* — Christopher Verdier
(74) *Attorney, Agent, or Firm* — Altis Law Group, Inc.

(57) ABSTRACT

A fan assembly (20) used for dissipating heat from an electronic device. The fan assembly includes a bracket (30) and a fan module (40). The bracket has two parallel retaining walls (31). Each retaining wall defines an opening (311) and two recesses (313) at opposite sides of the opening. The fan module is received in the bracket. The fan module includes a fan (50) and a pair of clamping members (60). The fan has a pair of fan openings in alignment with the openings of the bracket for airflow flowing therethrough. The clamping members are respectively attached to opposite sides of the fan. A pair of resilient arms (67) extends out from each clamping member. Each resilient arm has an engaging portion (671) received in the corresponding recess of one of the retaining walls. The fan module is retained in the bracket via the engaging portions engaging with the recesses and being sandwiched between the retaining walls.

20 Claims, 3 Drawing Sheets ized. The fan assembly of the invention has few parts,

FAN ASSEMBLY

This application is related to co-pending U.S. patent application Ser. No. 11/738,525, filed on Apr. 23, 2007, and entitled "FAN ASSEMBLY". The present application and the co-pending application are assigned to the same assignee. The disclosure of the above-identified application is incorporated herein by reference.

BACKGROUND OF THE INVENTION

1. Field of the Invention

The present invention relates to a fan assembly, and more particularly to a fan assembly for dissipating heat from electronic devices.

2. Description of Related Art

In the computer industry, a computer system, such as a server, is often configured to facilitate reliable and continuous operation. Computer systems typically have multiple power supplies and fans, and each device is usually screwed to a chassis of the server. If one of these components fails or malfunctions, the component may affect continuing operation of the system until a service technician can subsequently replace the failed component. Unfortunately, some systems do not provide hot-plug components, which enable a service technician to replace the failed component during operation of the system. Thus, replacing the failed component requires shutting down the system and removing screws from the component. As a result, the replacement of the failed component can create downtime.

Further, some fixtures are used for latching the fans, such as a fan rack as presented in US patent application 20040256334. A modularized fan rack is installed in a reserved space of electronic equipment for mounting several fans, which comprises a base board, having a hollow installing section with a plurality of fixtures disposed respectively on two corresponding sides. The distance between any two adjacent fixtures is substantially equal to the length of the fan being mounted onto the base board. A ventilation board with a plurality of openings for ventilating air therethrough, is disposed on the surface of one end of the base board. Two side boards are respectively disposed on both ends of the ventilation board adjacent to the base board and on the side away from the base board. The same fan being coupled by any two adjacent fixtures and another fixture being disposed adjacent to the fixture for mounting a fan adjacent to the side boards. This fan rack has a lot of components for co-retaining the fans, and assembling the fans to the base board is time-consuming.

What is needed, therefore, is to provide a fan assembly, which has a simple structure, and is easy to maintain.

SUMMARY OF THE INVENTION

A fan assembly used for dissipating heat from an electronic device. The fan assembly includes a bracket and a fan module. The bracket has two parallel retaining walls. Each retaining wall defines an opening and two recesses at opposite sides of the opening. The fan module is received in the bracket. The fan module includes a fan and a pair of clamping members. The fan has a pair of fan openings in alignment with the openings of the bracket for airflow flowing therethrough. The clamping members are respectively attached to opposite sides of the fan. A pair of resilient arms extends out from each clamping member. Each resilient arm has an engaging portion received in the corresponding recess of one of the retaining walls. The fan module is retained in the bracket via the engaging portions engaging with the recesses and being sandwiched between the retaining walls.

Other advantages and novel features of the present invention will become more apparent from the following detailed description of a preferred embodiment when taken in conjunction with the accompanying drawings, in which:

DETAILED DESCRIPTION OF THE INVENTION

Figure 1:
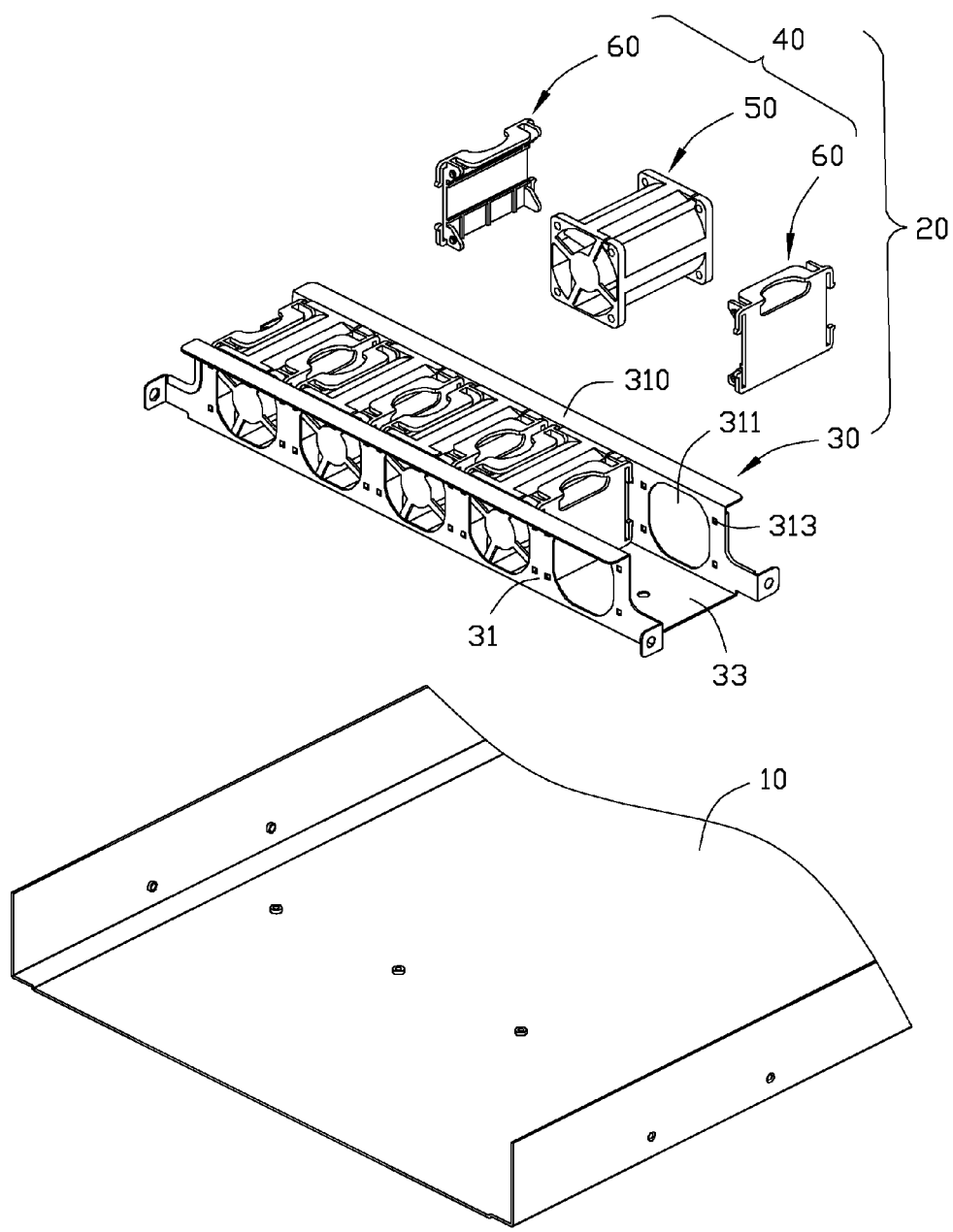
FIG. 1 is a partially exploded, isometric view of a fan assembly according to a preferred embodiment of the present invention, the fan assembly can be secured within a chassis which is partially shown, the fan assembly including a fan bracket and a plurality of fan modules.

Referring to FIG. 1, a fan assembly 20 of an embodiment of the present invention can be placed within a chassis 10 for dissipating heat from an electronic device (not shown). The fan assembly 20 includes a fan bracket 30, and a plurality of fan modules 40.

The fan bracket 30 has a rectangular bottom wall 33, and a pair of retaining walls 31 perpendicularly extending up from opposite sides of the bottom wall 33. The fan bracket 30 is configured having a U-shaped corridor for receiving the fan modules 40. One of the retaining walls 31 is a mirror image of the other and defines a plurality of airflow openings 311 respectively aligned with the corresponding airflow openings of the other. Two recesses 313 are defined at each of two opposite sides of each airflow opening 311. A flange 310 extends out from a top edge of each retaining wall 31.

Figure 2:
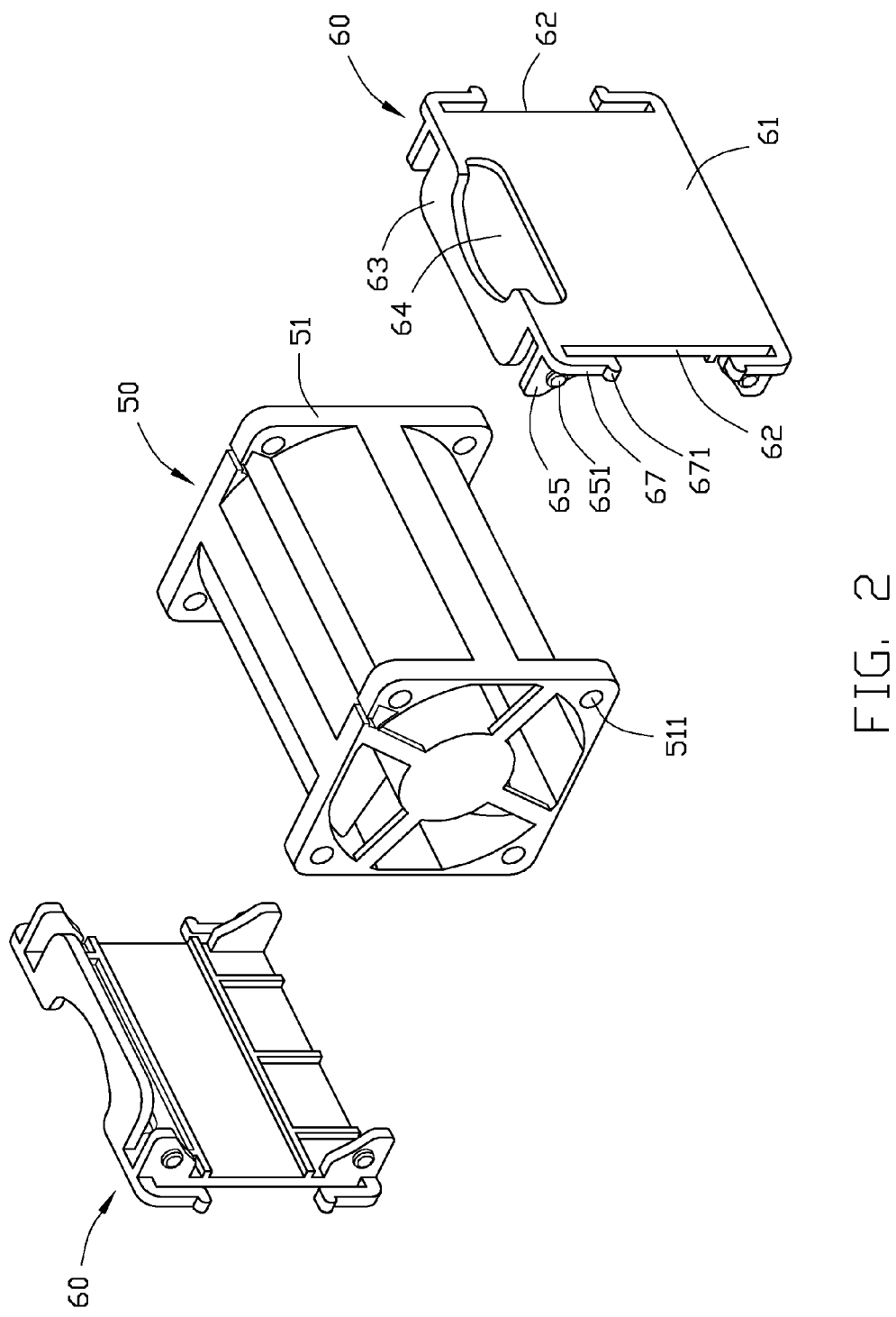
FIG. 2 is an enlarged, exploded view of a fan module of FIG. 1.

Referring also to FIG. 2, each fan module 40 includes a fan 50 and a pair of clamping members 60. In one embodiment, at least one clamping member 60 is employed in each fan module 40. The fan 50 is generally cubic-shaped. The fan 50 has two opposite rectangular side walls 51 each defining a fan opening corresponding to one of the airflow openings 311 of the fan bracket 30. Each side wall 51 defines a locking hole 511 at each corner thereof. Each clamping member 60 has a rectangular base wall 61. An operating portion 63 extends horizontally from a top edge of the base wall 61. The operating portion 63 and the base wall 61 cooperatively define a finger opening 64 in a conjunction area thereof. Two pairs of elastic ears 65 are formed on corners of the base wall 61. A post 651 is formed on each ear 65 corresponding to one of the locking holes 511. At least one pair of posts 651 is perpendicularly formed on each clamping member 60 for engaging with a pair of locking holes 511. The base wall 61 has two side edges 62. A pair of resilient arms 67 respectively extends oppositely from opposite ends of each side edge 62 with a space between each resilient arm 67 and the side edge 62. The resilient arms 67 located at the same side edge of the base wall extend toward each other from opposite ends of the side edge. An engaging portion 671, such as a barb, protrudes out from a distal end of each resilient arm 67 corresponding to one of the recesses 313 of the fan bracket 30. Each engaging portion 671 has a smooth arcuate surface.

Figure 3:
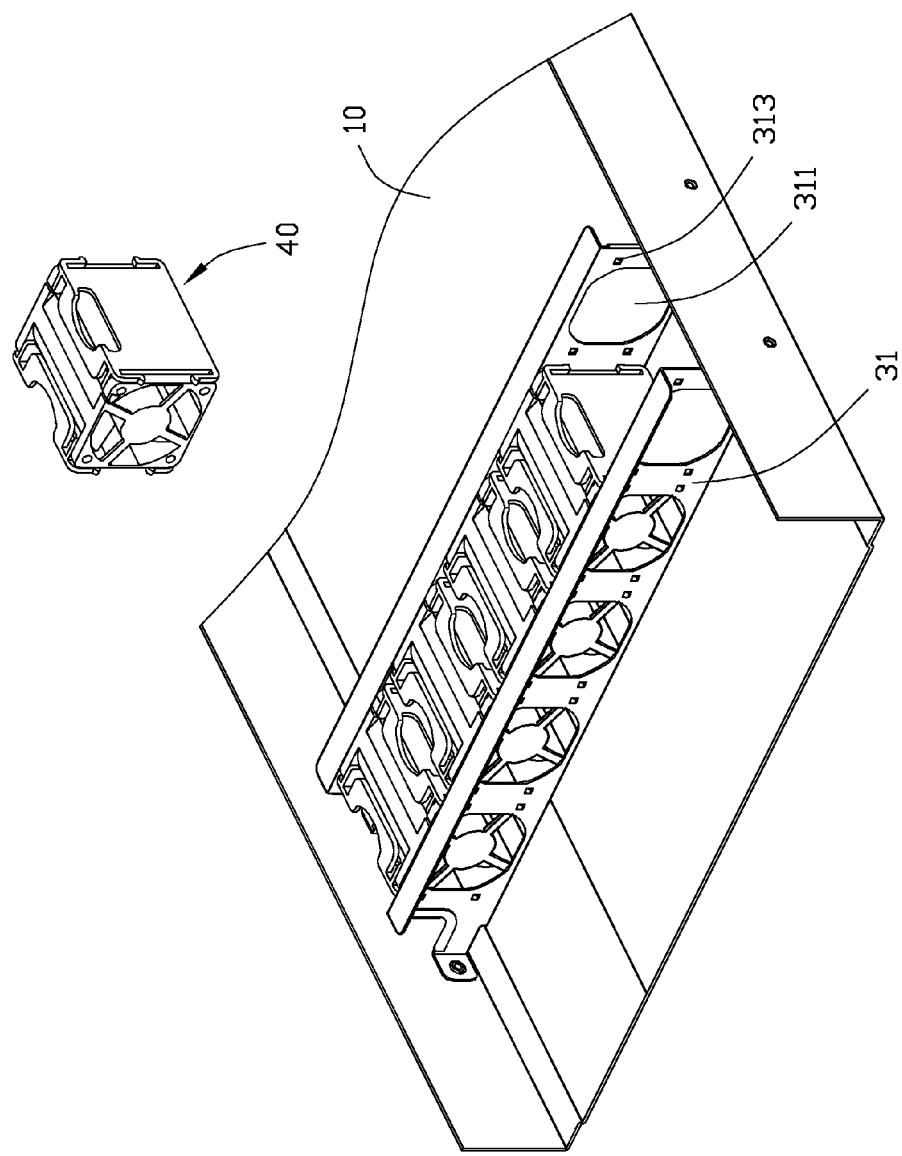
FIG. 3 is an assembled view of FIG. 1.

Referring also to FIG. 3, when assembling the fan assembly 20, the fan bracket 30 is positioned in the chassis 10. Then for each of the plurality of fan modules 40, two clamping members 60 are attached to one of the fans 50, via the posts 651 being correspondingly inserted into the locking holes 511 of the fan 50. Each of the plurality of fan modules 40 is then received side-by-side in the U-shaped corridor. Each resilient arm 67 is pressed and resiliently inflected toward the corresponding side edge 62 when each engaging portion 671 abuts on the inner surface of the corresponding retaining wall 31 as the fan module 40 moves into the fan bracket 30. As each of the fan modules 40 is fully received into the fan bracket 30, each of the resilient arms 67 rebound causing the engaging portions 671 to engage in the corresponding recess 313. When removing one of the fan modules 40, the module 40 is lifted up by application of appropriate force on the finger openings 64, so that the engaging portions 671 disengage from the corresponding recesses 313.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A fan assembly for dissipating heat from an electronic device, the fan assembly comprising:
    a bracket having two parallel retaining walls, each retaining wall defining an opening and two recesses at opposite sides of the opening; and
    a fan module received in the bracket, comprising a fan and a pair of clamping members, the fan having a pair of fan openings in alignment with the openings of the bracket for airflow flowing therethrough, the clamping members respectively attached to opposite sides of the fan, a pair of resilient arms extending out from each clamping member, each resilient arm having an engaging portion received in the corresponding recess of the one of the retaining walls, wherein the fan module is retained in the bracket via the engaging portions engaging with the recesses and being sandwiched between the retaining walls.

2. The fan assembly as described in claim 1, wherein the clamping members are perpendicular to the retaining walls, and the pair of resilient arms extends toward each other along a direction substantially parallel to the retaining wall.

3. The fan assembly as described in claim 1, wherein each resilient arm extends from an outer edge of the clamping member with a space formed therebetween.

4. The fan assembly as described in claim 1, wherein each engaging portion has a smooth arcuate surface such that the engaging portion is capable of sliding into or out from the corresponding recess smoothly.

5. The fan assembly as described in claim 1, wherein at least one pair of posts is perpendicularly formed on each clamping member for engaging with a pair of locking holes defined in the fan.

6. The fan assembly as described in claim 1, wherein each clamping member comprises a base wall, and an operating portion is perpendicularly formed on the base wall for lifting up the fan module, and a finger opening is defined between the base and the operating portion for facilitating the lifting.

7. The fan assembly as described in claim 1, wherein each engaging portion is disengageable from the corresponding recess by pulling the corresponding fan module with adequate force in a direction parallel to the retaining walls.

8. A fan assembly for dissipating heat from an electronic device, the fan assembly comprising:
    a bracket having a pair of parallel retaining walls with a space formed therebetween, each retaining wall defining an opening and a recess; and
    a fan module, comprising a fan and at least one clamping member, the at least one clamping member attached to one side of the fan, two resilient arms formed on opposite sides of the clamping member, an engaging portion formed on each resilient arm corresponding to each recess, wherein each resilient arm is capable of being resiliently deflected by a respective one of the retaining walls when the fan module is slid into the space, and the engaging portions respectively engage with the corresponding recesses from an inner side of each retaining wall after the resilient arms rebound.

9. The fan assembly as described in claim 8, wherein another clamping member is provided to attach to an opposite side of the fan for cooperatively retaining the fan in the bracket.

10. The fan assembly as described in claim 8, wherein each resilient arm extends from an outer edge of the clamping member with a space therebetween.

11. The fan assembly as described in claim 8, wherein each engaging portion has a smooth arcuate surface.

12. The fan assembly as described in claim 8, wherein at least one pair of posts is perpendicularly formed on the clamping member for inserting into a pair of locking holes defined in the fan.

13. The fan assembly as described in claim 8, wherein the clamping member comprises a base wall, and an operating portion is bent from a top of the base wall for lifting up the fan module, and a finger opening is defined between the base and the operating portion.

14. The fan assembly as described in claim 8, wherein each engaging portion is disengaged from the corresponding recess by pulling the fan module upwardly with adequate force.

15. The fan assembly as described in claim 8, wherein the clamping member is perpendicular to the retaining walls.

16. A fan assembly for dissipating heat from an electronic device mounted within a chassis, the fan assembly comprising:
    a bracket fixed within the chassis, the bracket comprising a pair of parallel retaining walls cooperatively defining a plurality of pairs of aligned openings, one recess being defined at each of opposite two sides of each of the openings; and
    a plurality of fan modules arranged between the retaining walls in a longitudinal direction of the retaining walls, each of the fan modules comprising a fan sandwiched between the retaining walls and aligned with one corresponding pair of aligned openings, and a pair of clamping members secured to opposite sides of the fan perpendicular to the retaining walls, a resilient arm being formed at each one of two opposite side edges of each of the clamping members and comprising an engaging portion engaging with a corresponding one of the recesses to thereby secure the fan to the bracket, wherein the engaging portion defines a slanted surface such that when the clamping members are lifted in a direction parallel to the retaining walls the slanted surface is capable of guiding the engaging portion sliding out from the corresponding recess.

17. The fan assembly as claimed in claim 16, wherein each resilient arm has a space formed between the resilient arm and the corresponding side edge of the clamping member such that the resilient arm is capable of being resiliently deflected toward the space by the retaining wall when the fan module is slid into the bracket.

18. The fan assembly as claimed in claim 17, wherein the clamping member comprises a rectangular base wall and an operating portion extending from one side of the base wall, and the resilient arms are formed at opposite side edges of the base wall.

19. The fan assembly as claimed in claim 17, wherein the clamping member further comprises another resilient arm formed at each of the opposite side edges of the base wall, the resilient arms located at the same side edge of the base wall extending toward each other from opposite ends of said side edge.

20. The fan assembly as claimed in claim 19, wherein a tab is perpendicularly formed at each corner of the base wall, a post extends perpendicularly from each tab, the fan comprises a pair of opposite side walls each defining a plurality of holes, and the tabs are located between the side walls of the fan and are capable of being deformed to allow the posts to insert into a corresponding hole of the fan.

* * * * *